(12) United States Patent
Domae et al.

(10) Patent No.: US 11,201,171 B2
(45) Date of Patent: Dec. 14, 2021

(54) SEMICONDUCTOR STORAGE DEVICE

(71) Applicant: KIOXIA CORPORATION, Tokyo (JP)

(72) Inventors: Sumiko Domae, Yokohama Kanagawa (JP); Daisaburo Takashima, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/008,236

(22) Filed: Aug. 31, 2020

(65) Prior Publication Data

US 2021/0082959 A1 Mar. 18, 2021

(30) Foreign Application Priority Data

Sep. 17, 2019 (JP) .............................. JP2019-168736

(51) Int. Cl.
| | |
|---|---|
| *G11C 7/06* | (2006.01) |
| *H01L 27/11597* | (2017.01) |
| *H01L 27/11592* | (2017.01) |
| *H01L 27/11509* | (2017.01) |
| *H01L 29/78* | (2006.01) |
| *H01L 29/66* | (2006.01) |
| *G11C 7/18* | (2006.01) |
| *H01L 27/11514* | (2017.01) |

(52) U.S. Cl.
CPC ......... *H01L 27/11597* (2013.01); *G11C 7/06* (2013.01); *G11C 7/18* (2013.01); *H01L 27/11509* (2013.01); *H01L 27/11514* (2013.01); *H01L 27/11592* (2013.01); *H01L 29/6684* (2013.01); *H01L 29/78391* (2014.09)

(58) Field of Classification Search
CPC ......... H01L 27/11597; H01L 27/11592; H01L 27/11509; H01L 29/78391; H01L 29/6684; H01L 27/11514; G11C 7/06; G11C 7/18
USPC .............................................. 365/145, 185.24
See application file for complete search history.

(56) References Cited

U.S. PATENT DOCUMENTS

| | | | | |
|---|---|---|---|---|
| 2005/0161716 | A1* | 7/2005 | Matsuura | ........... H01L 21/02178 257/295 |
| 2007/0228431 | A1* | 10/2007 | Wang | ................ H01L 27/11507 257/295 |
| 2008/0136990 | A1* | 6/2008 | Kimura | ............. G02F 1/136286 349/46 |
| 2008/0180984 | A1 | 7/2008 | Takashima et al. | |
| 2010/0052023 | A1* | 3/2010 | Kanaya | .................... H01L 28/65 257/295 |
| 2016/0372478 | A1 | 12/2016 | Ino et al. | |

(Continued)

FOREIGN PATENT DOCUMENTS

| | | |
|---|---|---|
| JP | 2008-171525 A | 7/2008 |
| WO | 2015/141626 A1 | 9/2015 |

*Primary Examiner* — Michael T Tran

(74) *Attorney, Agent, or Firm* — Kim & Stewart LLP

(57) ABSTRACT

A semiconductor storage device includes a stacked body and a columnar body. The stacked body includes a plurality of conductive layers spaced apart from each other in a stacking direction. The columnar body penetrates the stacked body in the stacking direction. The columnar body includes a columnar ferroelectric film, a semiconductor film disposed between the ferroelectric film and the conductive layers, and an insulating film disposed between the semiconductor film and the conductive layers.

18 Claims, 12 Drawing Sheets

(56) References Cited

U.S. PATENT DOCUMENTS

| | | | |
|---|---|---|---|
| 2018/0061468 A1* | 3/2018 | Derner | H01L 27/11507 |
| 2018/0331113 A1* | 11/2018 | Liao | H01L 28/40 |
| 2019/0066751 A1* | 2/2019 | Matsubara | H01L 27/11502 |
| 2019/0123061 A1* | 4/2019 | Liu | G11C 11/2273 |
| 2019/0304988 A1* | 10/2019 | Dong | H01L 29/40111 |
| 2020/0227439 A1* | 7/2020 | Sato | H01L 27/11587 |
| 2020/0235221 A1* | 7/2020 | Sharma | H01L 27/1104 |
| 2020/0279598 A1* | 9/2020 | Jiang | G11C 11/2255 |
| 2020/0294995 A1* | 9/2020 | Kim | H01L 21/8221 |
| 2020/0312978 A1* | 10/2020 | Kavalieros | H01L 29/785 |
| 2020/0343265 A1* | 10/2020 | Chang | G11C 11/221 |
| 2020/0373312 A1* | 11/2020 | Sharma | H01L 27/11507 |

\* cited by examiner

FIG. 6A
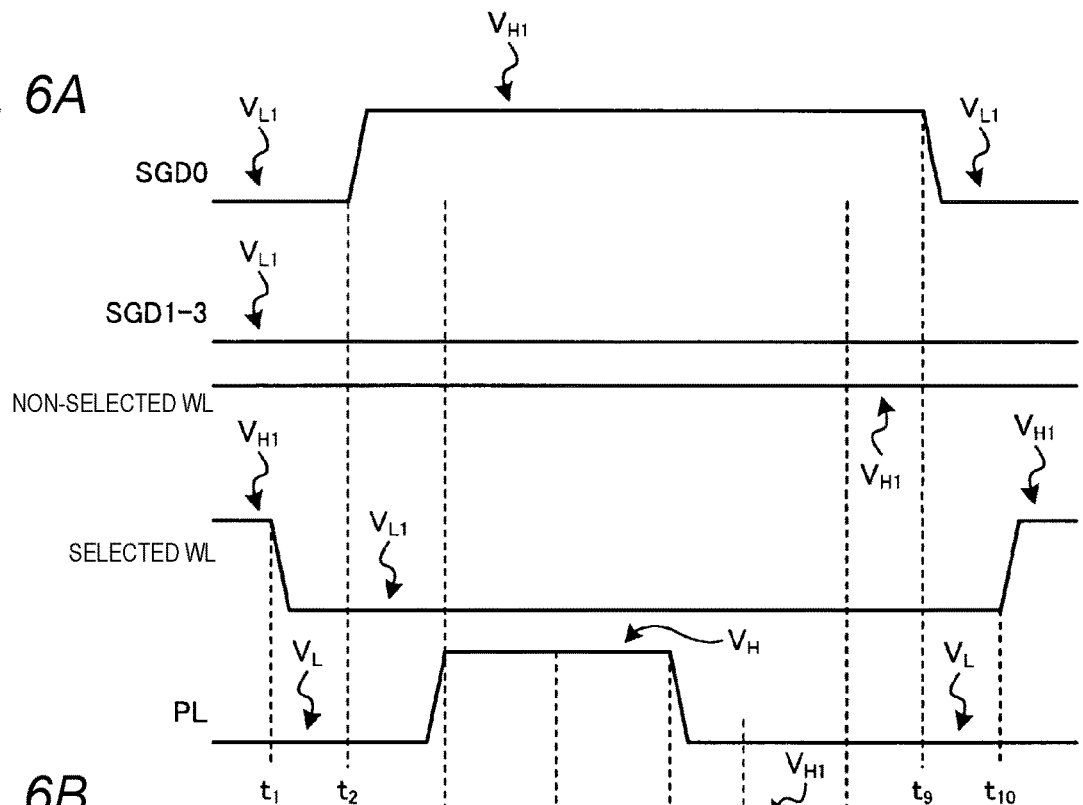
FIG. 6B
FIG. 6C
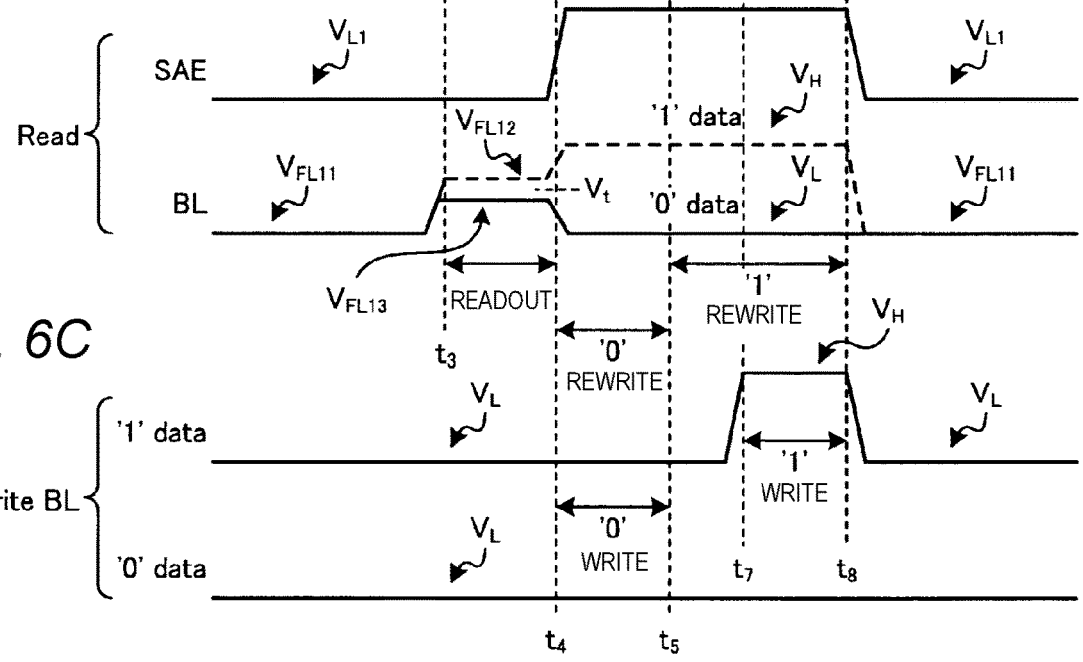

FIG. 8A
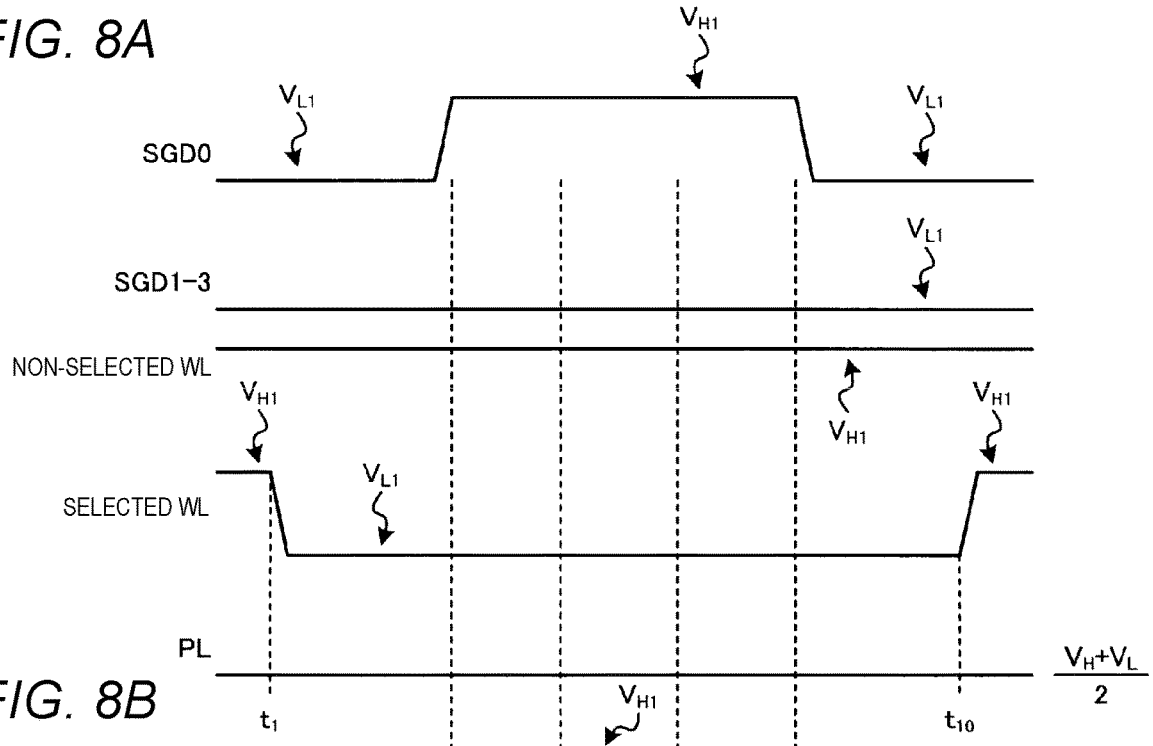
FIG. 8B
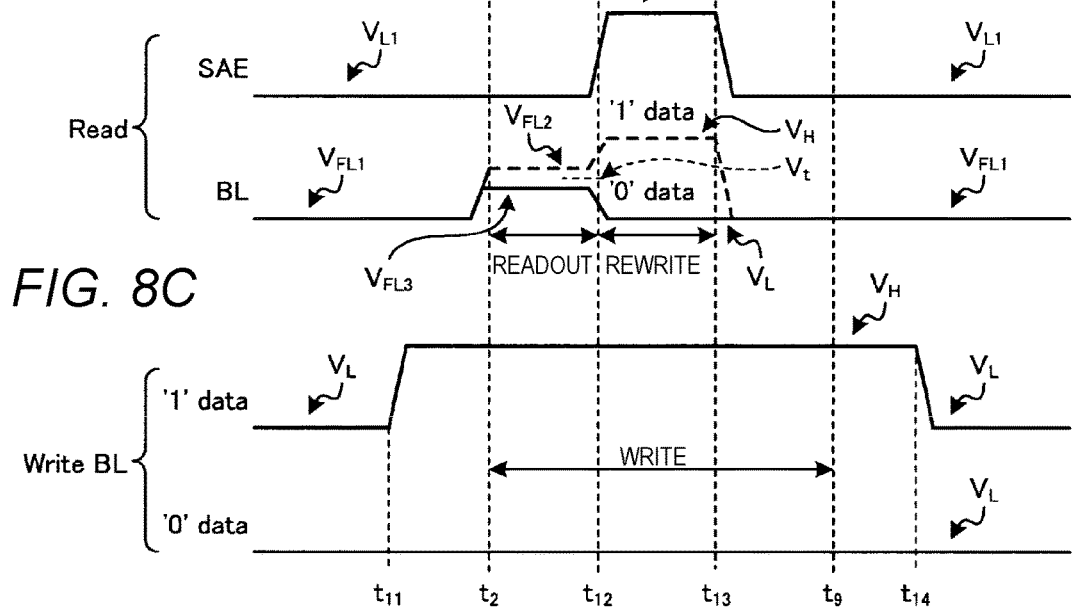
FIG. 8C

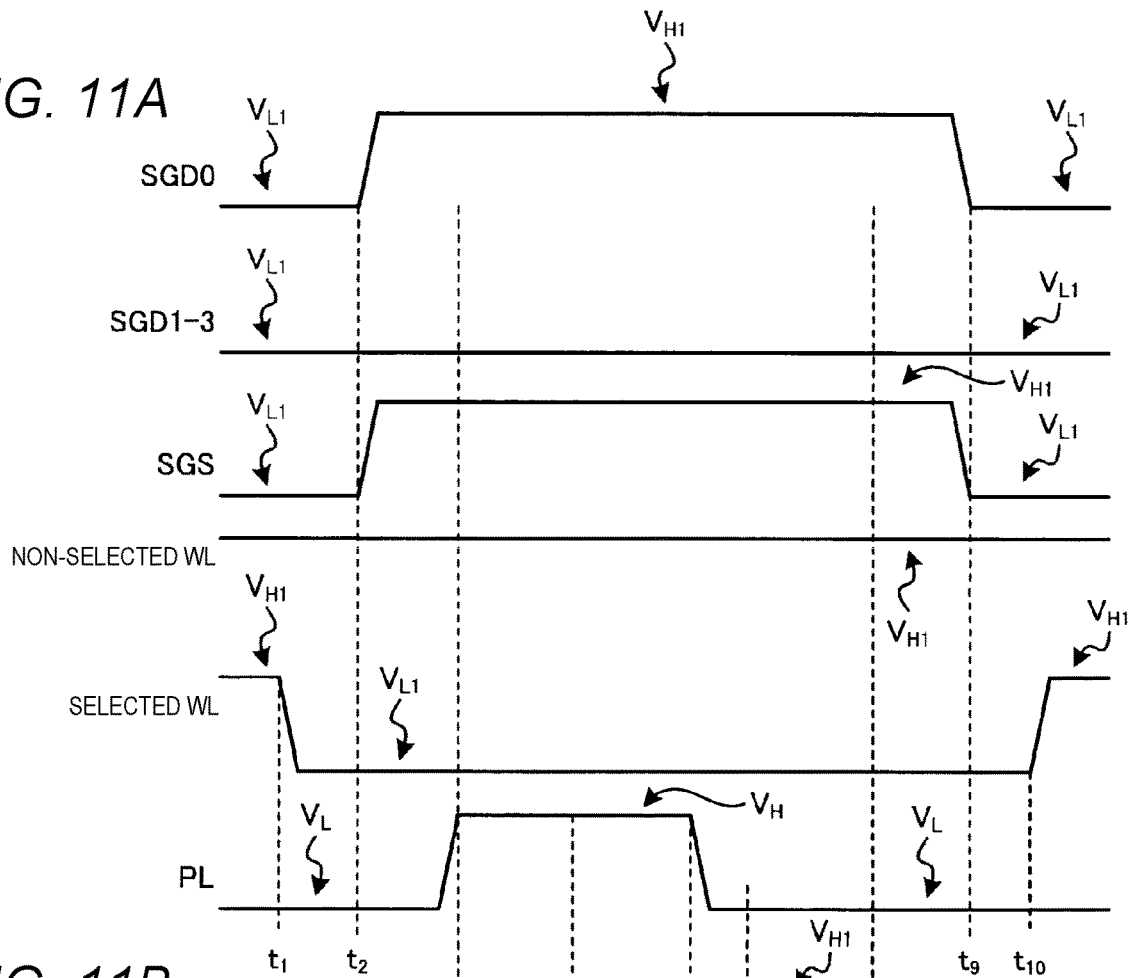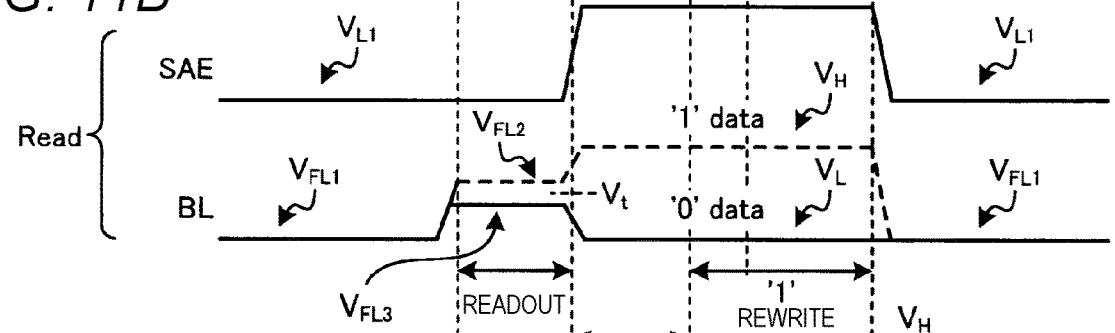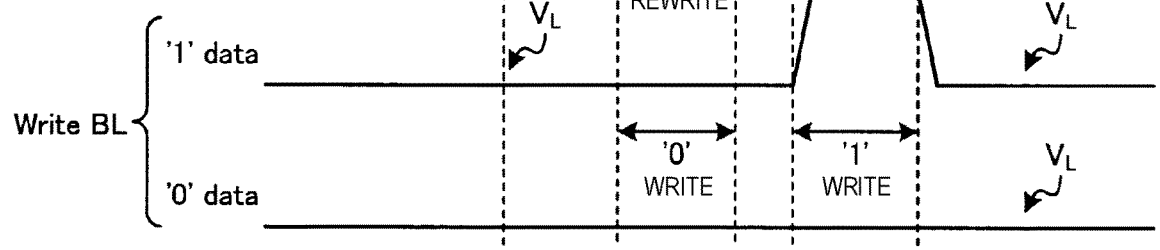

SEMICONDUCTOR STORAGE DEVICE

This application is based upon and claims the benefit of priority from Japanese Patent Application No. 2019-168736, filed Sep. 17, 2019; the entire contents of which are incorporated herein by reference.

FIELD

Embodiments described herein relate generally to a semiconductor storage device.

BACKGROUND

In a semiconductor storage device such as a ferroelectric memory including a plurality of memory cells in which a source and a drain of a transistor are connected to both ends of a ferroelectric, data is stored by turning off a transistor of a selected memory cell and accumulating charges in the ferroelectric material. It is desirable to achieve high integration in such a semiconductor storage device.

BRIEF DESCRIPTION OF THE DRAWINGS

FIGS. 6A to 6C are waveform diagrams showing operation of the semiconductor storage device according to the embodiment;

FIGS. 8A to 8C are waveform diagrams showing operation of a semiconductor storage device according to a first modification of the embodiment;

FIGS. 11A to 11C are waveform diagrams showing operation of a semiconductor storage device according to the second modification of the embodiment.

DETAILED DESCRIPTION

An embodiment provides a semiconductor storage device that can achieve high integration.

In general, according to one embodiment, there is provided a semiconductor storage device having a stacked body and a columnar body. The stacked body includes a plurality of conductive layers spaced apart from each other in a stacking direction. The columnar body penetrates the stacked body in the stacking direction. The columnar body includes a columnar ferroelectric film, a semiconductor film disposed between the ferroelectric and the conductive layers, and an insulating film disposed between the semiconductor film and the conductive layers.

Hereinafter, a semiconductor storage device according to the embodiment will be described in detail with reference to the appended drawings. The scope of the present disclosure is not limited to the following embodiment.

Embodiment

A semiconductor storage device according to the embodiment is a nonvolatile semiconductor storage device, and is, for example, a ferroelectric memory including a plurality of memory cells in which a source and a drain of a transistor are connected to both ends of a ferroelectric material.

In the present embodiment, the semiconductor storage device (for example, the ferroelectric memory) achieves high integration by alternatively stacking conductive layers and insulating layers on a substrate and penetrating the stacked body by a columnar body including a ferroelectric film and a semiconductor film, to form a three-dimensional memory cell array having memory cells at each position where the conductive layers intersect with the columnar body.

Figure 1:
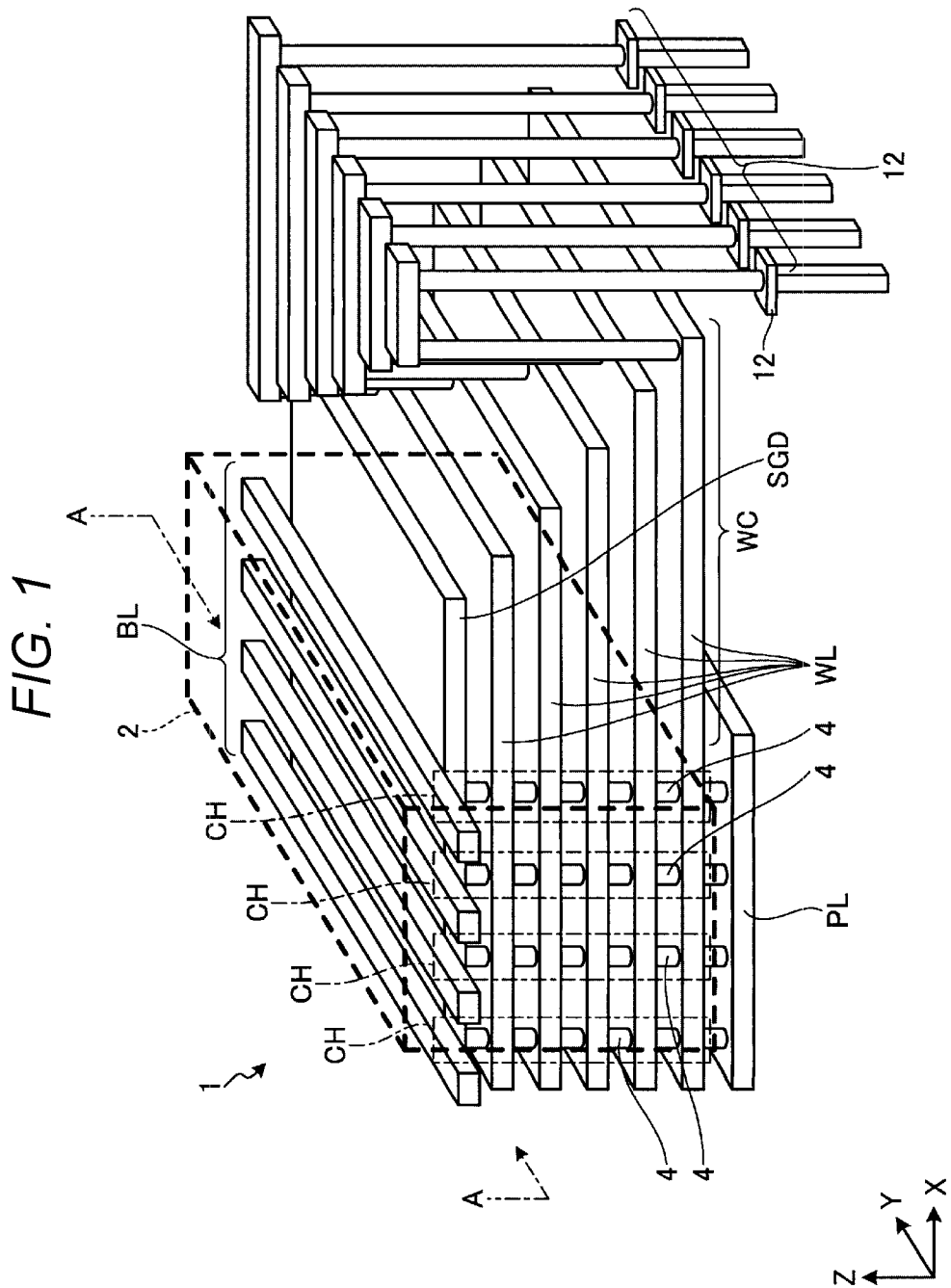
FIG. 1 is a perspective view showing a configuration of a semiconductor storage device according to an embodiment.

Specifically, a semiconductor storage device 1 is configured as shown in FIG. 1. FIG. 1 is a perspective view showing a configuration of the semiconductor storage device 1.

The semiconductor storage device 1 is a three-dimensional semiconductor memory, and is, for example, a ferroelectric memory. The semiconductor storage device 1 includes a memory cell array 2, word lines WL, select gate lines SGD, bit lines BL, and plate lines PL. Hereinafter, an extension direction of the bit line BL is a Y direction, a stacking direction of memory cell transistors is a Z direction, and a direction perpendicular to the Y direction and the Z direction is an X direction.

Figure 3:
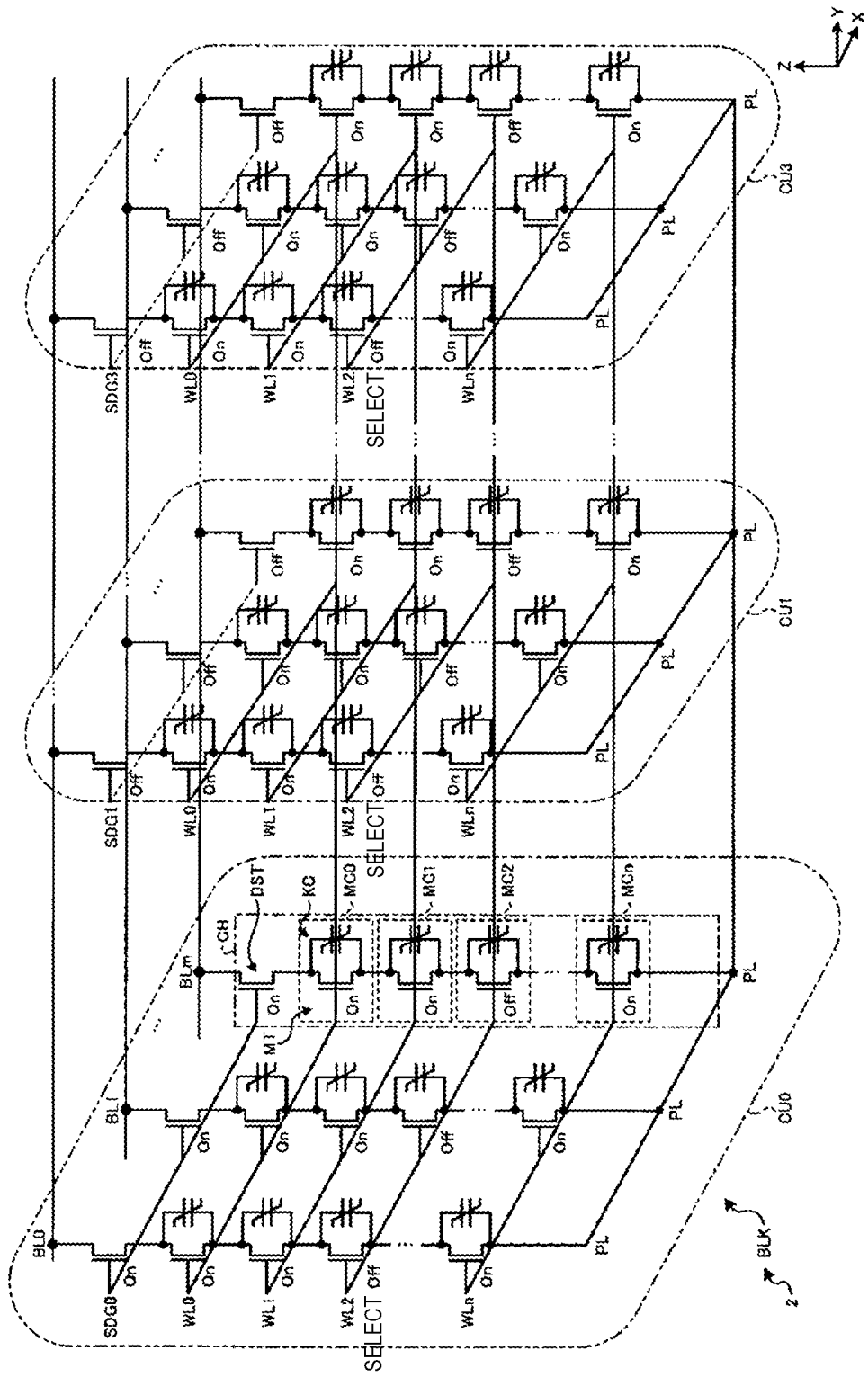
FIG. 3 is a circuit diagram showing a configuration of a memory cell array according to the embodiment.
Figure 4:
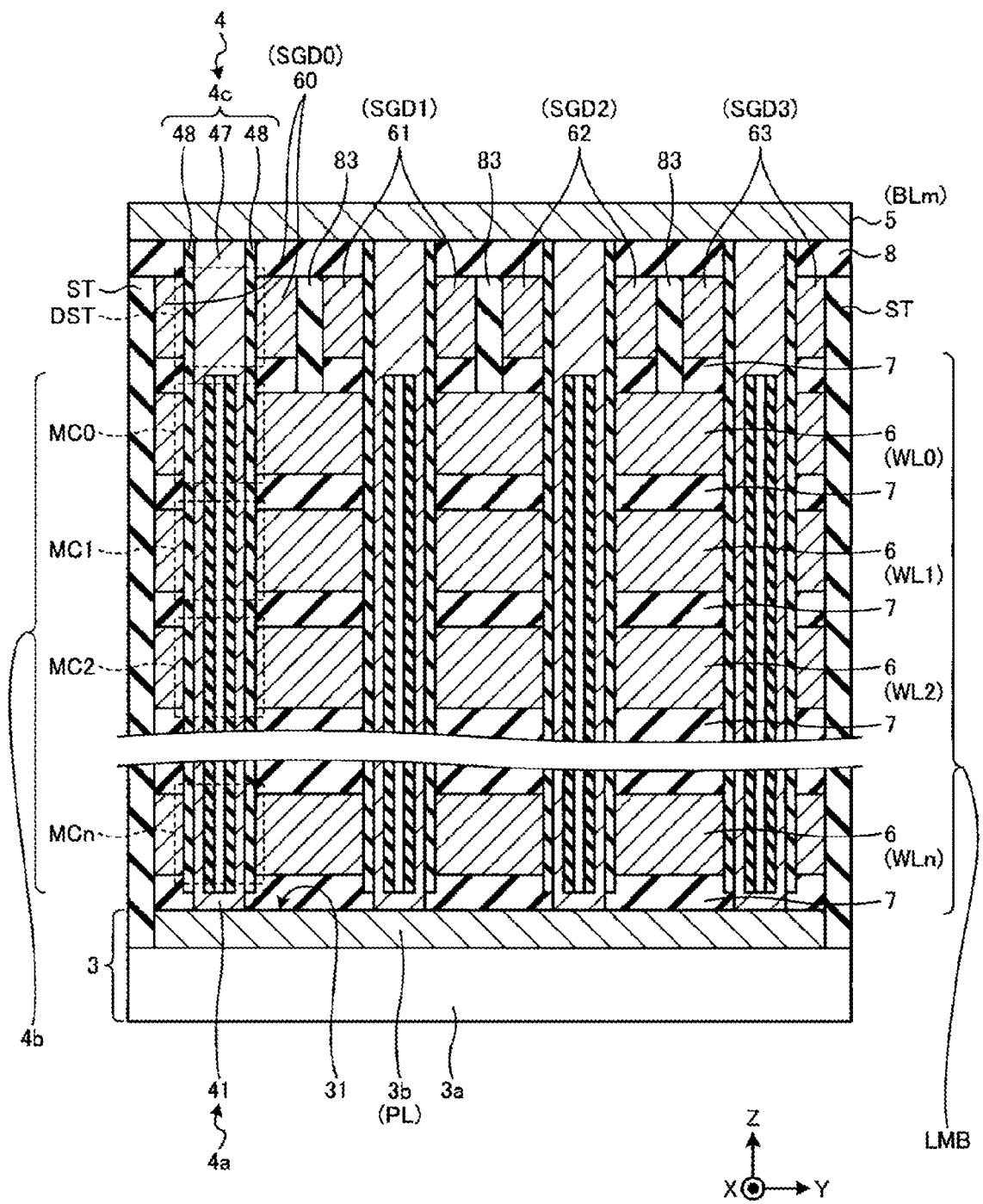
FIG. 4 is a cross-sectional view showing the configuration of the memory cell array according to the embodiment.

The memory cell array 2 shown in FIG. 1 includes a plurality of memory chains CH arranged on a substrate 3 (see FIG. 4). Each of the plurality of memory chains CH includes a memory cell column in which one or more memory cells are arranged in the Z direction and a drain-side select transistor provided at an upper end of the memory cell column. In the memory chain CH, a plurality of memory cells MC0 to MCn are connected in series in a chain. The plurality of memory cells MC0 to MCn (n is any integer of 2 or more) and a select transistor DST (see FIG. 3) are formed at positions where conductive layers (WL, SGD) and a columnar body 4 intersect in a structure in which the columnar body 4 penetrates a stacked body LMB (see FIG. 4) in which the conductive layers (WL, SGD) and insulating layers are alternately and repeatedly arranged in the Z direction. Each of the memory cells MC0 to MCn is a one-transistor one-capacitor type memory cell and includes a memory transistor MT and a ferroelectric capacitor KC (see FIG. 3). In the memory cells MC0 to MCn, a portion of the plate-shaped conductive layers (referred to herein as word lines WL) that intersect the columnar body 4 functions as a gate of the memory transistor MT. In the drain-side select transistor DST, a portion of the plate-shaped conductive layers (referred to herein as select gate lines SGD) that intersect the columnar body 4 functions as a gate. FIG. 1 illustrates a configuration in which five memory cells MC are provided in one memory chain CH.

The word line WL extends in an XY direction and connects gates of memory cells (of different memory chains CH) that are at the same height above the substrate. The select gate line SGD extends in the XY direction and connects gates of drain-side select transistors DST of different memory chains CH. The bit line BL extends along the Y direction and is connected to a +Z side end portion of each memory chain CH.

Figure 2:
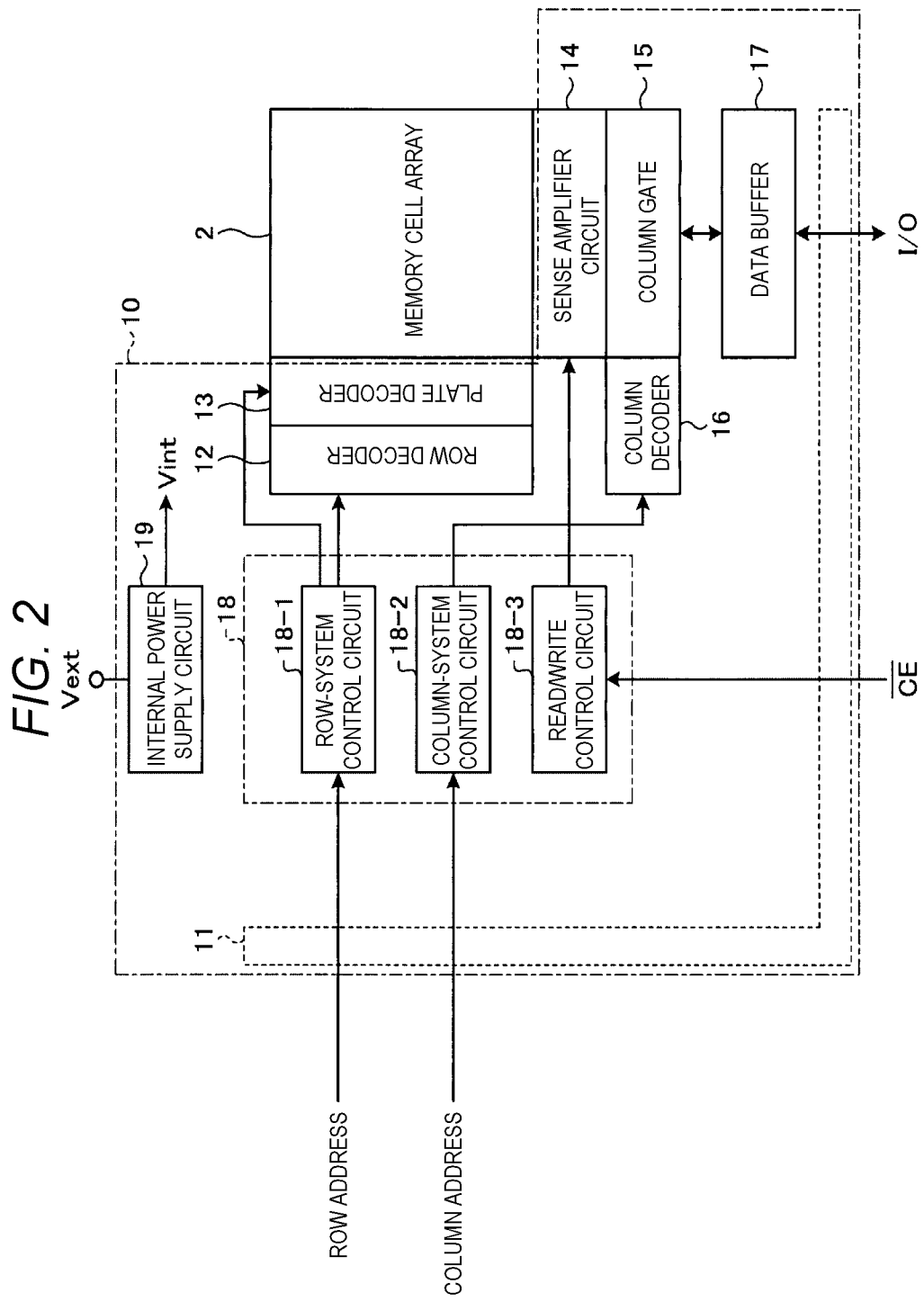
FIG. 2 is a block diagram showing the configuration of the semiconductor storage device according to the embodiment.

The semiconductor storage device 1 further includes a peripheral circuit 10 as shown in FIG. 2. FIG. 2 is a block diagram showing the configuration of the semiconductor storage device 1. The peripheral circuit 10 is provided around the memory cell array 2. The peripheral circuit 10 has an interface 11 with the outside (for example, a memory controller) of the semiconductor storage device 1.

The peripheral circuit 10 controls operation of the semiconductor storage device 1 based on an instruction received from the outside via the interface 11. For example, when a write command including write data, a row address and a column address, is received, the peripheral circuit 10 performs a write operation of writing the write data into a memory cell of the row address and the column address in the memory cell array 2. When a read command including a row address and a column address is received, the peripheral circuit 10 performs a read operation of reading data from the memory cell of the row address and the column address and outputting the data to the outside (e.g., memory controller) via the interface 11.

The peripheral circuit 10 further includes a row decoder 12, a plate decoder 13, a sense amplifier circuit 14, a column gate 15, a column decoder 16, a data buffer 17, a control circuit 18, and an internal power supply circuit 19. The control circuit 18 includes a row-system control circuit 18-1, a column-system control circuit 18-2, and a read/write control circuit 18-3.

The sense amplifier circuit 14 includes a plurality of sense amplifiers corresponding to a plurality of bit lines BL. Each sense amplifier detects and amplifies data read to a corresponding bit line BL. The column gate 15 has a plurality of gates corresponding to the plurality of sense amplifiers. The column gate 15 selects a column of the memory cell array 2 by activating one of the plurality of gates, and transfers data of the selected bit line BL to the data buffer 17. The column decoder 16 decodes a column control signal received from the column-system control circuit 18-2, and activates one of the plurality of gates in the column gate 15 according to a decoding result. The data buffer 17 temporarily stores data to be transferred between the sense amplifier circuit 14 and an I/O terminal of the interface 11.

The row-system control circuit 18-1 receives a row address and generates a row control signal and a plate control signal based on the row address. The row-system control circuit 18-1 supplies the row control signal to the row decoder 12, and supplies the plate control signal to the plate decoder 13. The column-system control circuit 18-2 receives a column address and generates a column control signal based on the column address. The column-system control circuit 18-2 supplies the column control signal to the column decoder 16. The read/write control circuit 18-3 supplies a sense amplifier enable signal SAE to the sense amplifier circuit 14. The sense amplifier circuit 14 includes the plurality of sense amplifiers corresponding to the plurality of bit lines. Each sense amplifier performs a sense amplifier operation according to the sense amplifier enable signal SAE at an active level (for example, H level), and controls a voltage of a corresponding bit line BL according to a result of the sense amplifier operation. The sense amplifier operation is an operation of detecting and amplifying data read to the corresponding bit line BL. Each sense amplifier stops the sense amplifier operation according to the sense amplifier enable signal SAE at a non-active level (for example, L level), and releases the control of the voltage of the corresponding bit line BL.

The row decoder 12 decodes the row control signal, and supplies a selected voltage to a selected word line WL and supplies a non-selected voltage to a non-selected word line WL based on a decoding result. Based on the decoding result, the row decoder 12 supplies a selected voltage to a selected select gate line SGD corresponding to a selected memory chain CH and supplies a non-selected voltage to a non-selected select gate line SGD. The plate decoder 13 controls the voltage of the plate line PL to a predetermined drive level based on the plate control signal.

The internal power supply circuit 19 that generates an internal power supply voltage Vint from an external power supply voltage Vext is also provided in a memory chip of the semiconductor storage device 1. The internal power supply circuit 19 may include a booster circuit that generates a boosted voltage as necessary.

A chip enable signal /CE supplied from outside the chip sets the memory chip to an active state. That is, normally, the memory cell array 2 is accessible by the control circuit 18 by turning on an external power supply and setting the chip enable signal /CE to the active level (for example, L level).

The row decoder 12 shown in FIG. 2 may be provided as shown in FIG. 1. In FIG. 1, the word lines WL and the select gate lines SGD of the memory cell array 2 and the row decoder 12 are connected via a corresponding contact-upper wiring-contact at a word line contact portion WC (hereinafter referred to as electrode line contact portion) provided in the memory cell array 2. FIG. 1 illustrates a structure in the word line contact portion WC provided on a +X side of the memory cell array 2. In the structure, the memory cells MC of different heights, the word lines WL and the select gate lines SGD connected to the select transistors are processed in a step shape.

Next, a circuit configuration of the memory cell array 2 will be described with reference to FIG. 3. FIG. 3 is a diagram showing the circuit configuration of the memory cell array 2. FIG. 3 illustrates one block BLK among a plurality of blocks BLK in the memory cell array 2.

In FIG. 3, for example, the block BLK includes n+1 (n is an integer of 2 or more) word lines WL0 to WLn, a plurality of select gate lines SGD0 to SGD3, and plate lines PL. In addition, the block BLK further includes m+1 (m is an integer of 2 or more) bit lines BL0 to BLm. In accordance with the plurality of select gate lines SGD0 to SGD3, the block BLK may be divided into a plurality of chain units CU0 to CU3. The plurality of chain units CU0 to CU3 function as a plurality of drive units in the block BLK. Each of the chain units CU0 to CU3 includes a plurality of memory chains CH sharing a select gate line SGD.

In the block BLK, m+1 memory chains CH are arranged in the X direction for each chain unit. The m+1 memory chains CH correspond to m+1 bit lines BL0 to BLm, and the memory chains CH are connected to the corresponding bit lines BL0 to BLm on the +Z side. Four memory chains CH are arranged in the Y direction and connected to each bit line BL on the +Z side.

That is, (m+1)×4 memory chains CH are arranged in the X direction and the Y direction. The (m+1)×4 memory chains CH correspond to one plate line PL (see FIG. 1) and are connected to the plate line PL on a −Z side. In FIG. 1, the plate line PL is shown as a set of a plurality of lines electrically connected to each other.

In the memory chain CH, the select transistor DST and the memory cells MC0 to MCn are arranged along the Z direction. Each of the memory cells MC0 to MCn is, for example, a one-transistor one-capacitor type memory cell and includes a memory transistor MT and a ferroelectric capacitor KC connected in parallel. The memory transistor MT is, for example, one transistor. A plurality of memory transistors MT are connected in series. The ferroelectric capacitor KC is connected in parallel to each memory transistor MT. That is, one end of the ferroelectric capacitor KC is electrically connected to one of the source and the drain of the memory transistor MT, and the other end of the ferroelectric capacitor KC is electrically connected to the other of the source and the drain of the memory transistor MT.

Each of the select transistors DST is, for example, one transistor. Each memory chain CH is formed by connecting a drain-side select transistor DST in series to the memory transistor MT of the memory cell MC0 which is on a most drain side of the memory cells MC0 to MCn. Each select gate line SGD is electrically connected to a gate of each select transistor DST of a corresponding chain unit CU.

In each memory chain CH, the gate of each memory transistor MT is connected to the word line WL. One end of the memory chain CH is connected to the bit line BL via the drain-side select transistor DST, and the other end of each memory chain CH is connected to the plate line PL.

Next, a specific configuration of the memory cell array 2 will be described with reference to FIG. 4. FIG. 4 is a diagram showing a cross-sectional configuration of the memory cell array 2, and shows a cross section (in particular, YZ cross section) when the memory cell array 2 shown in FIG. 1 is cut in the vertical direction along a line A-A (in particular, cut along the YZ plane).

In the memory cell array 2, as shown in FIG. 4, the columnar body 4 is arranged in two-dimensions (along X and Y directions) on the substrate 3. The stacked body LMB is penetrated by the columnar body 4 to form a three-dimensional array of memory cells.

The substrate 3 shown in FIG. 4 has a semiconductor region (well region) 3a and a semiconductor region 3b. Each of the semiconductor region 3a and the semiconductor region 3b contains an impurity of a first conductivity type. For example, when the first conductivity type is P-type, the impurity of the first conductivity type may be boron. The semiconductor region 3b has a higher concentration of the impurity of the first conductivity type than the semiconductor region 3a and functions as a buried conductive layer (plate line PL).

A plurality of stacked bodies including the stacked body LMB may be arranged on the substrate 3. The plurality of stacked bodies may be arranged at positions shifted from each other in the Y direction with a separation portion ST in between. In the separation portion ST, at least a surface that is in contact with the stacked body LMB is formed of an insulating material. The separation portion ST electrically separates the stacked body LMB from other stacked bodies. The separation portion ST has a fin shape extending in the X direction and the Z direction.

In the stacked body LMB, conductive layers 6 and insulating layers 7 are alternately and repeatedly stacked. In the stacked body LMB, a plurality of conductive layers 6 are arranged apart from each other in the Z direction. Each conductive layer 6 may be formed of a material containing a conductive material (for example, a metal such as tungsten) as a main component. Each insulating layer 7 may be formed of a material containing an insulating material (for example, a semiconductor oxide such as silicon oxide) as a main component. The stacked body LMB includes n+1 conductive layers 6. The n+1 conductive layers 6 function as word lines WLn, WL (n−1), . . . , WL2, WL1, and WL0 in order from the −Z side to the +Z side.

Drive electrode films 60 to 63 are stacked on an uppermost insulating layer 7 (most +Z side insulating layer 7) of the stacked body LMB. Each of the drive electrode films 60 to 63 may be formed of a material containing a conductive material (for example, a metal such as tungsten) as a main component. The drive electrode film 60 functions as a select gate line SGD0, the drive electrode film 61 functions as a select gate line SGD1, the drive electrode film 62 functions as a select gate line SGD2, and the drive electrode film 63 functions as a select gate line SGD3. The drive electrode films 60 to 63 are separated in the Y direction by insulating films 83. The insulating films 83 are provided above the word line WL (+Z side), extend in the Y direction and the Z direction, and reach the uppermost insulating layer 7 of the stacked body LMB. Accordingly, the drive electrode films 60 to 63 are electrically insulated from each other.

The columnar body 4 includes a columnar lower portion 4a, a columnar main portion 4b, and a columnar upper portion 4c. The columnar main portion 4b is disposed between the columnar lower portion 4a and the columnar upper portion 4c in the Z direction.

The columnar lower portion 4a is disposed on the substrate 3. The columnar lower portion 4a extends from a surface 31 of the substrate 3 to a Z position between the first conductive layer 6 (WLn) and the surface 31 of the substrate 3. The columnar lower portion 4a has a semiconductor film 41. The semiconductor film 41 is formed of a material containing a semiconductor (for example, silicon) as a main component and includes the impurity of the first conductivity type. When the first conductivity type is P-type, the impurity of the first conductivity type may be boron. The semiconductor film 41 may contain the impurity of the first conductivity type at the same concentration as the concentration of the impurity of the first conductivity type in the semiconductor region 3b. A lower end (end portion on the −Z side) of the semiconductor film 41 may reach a position lower than the surface 31 of the substrate 3 in the semiconductor region 3b. The semiconductor film 41 is electrically connected to the semiconductor region 3b (plate line PL).

The columnar main portion 4b is provided on the columnar lower portion 4a (+Z side). The columnar main portion 4b extends from the Z position between the first conductive layer 6 (WLn) and the surface 31 of the substrate 3 to a Z position between the (n+1)th conductive layer 6 (WL0) and the drive electrode films 60 to 63. In positions where the columnar main portion 4b intersects with the n+1 conductive layers 6 in the stacked body LMB, memory cells MCn, MC(n−1), . . . , MC2, MC1, MC0 are sequentially arranged from the −Z side to the +Z side.

Figure 5A:
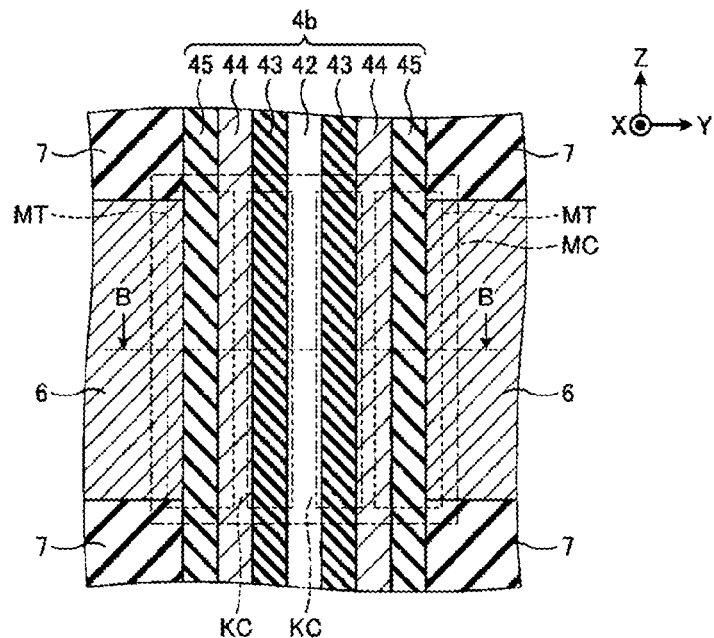
FIGS. 5A to 5C are cross-sectional views and an equivalent circuit diagram of a memory cell according to the embodiment.
Figure 5B:
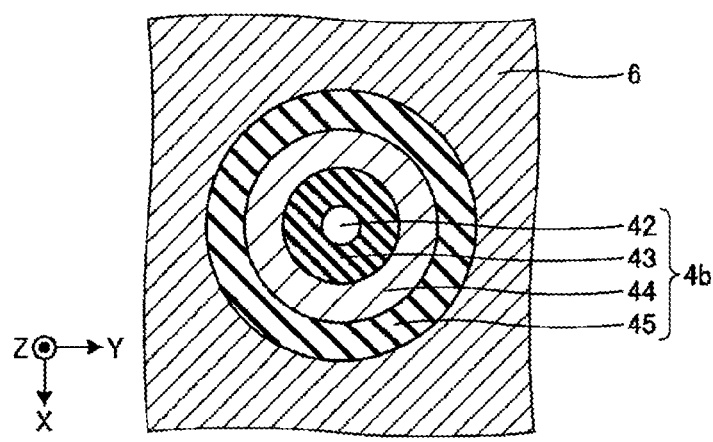
Figure 5C:
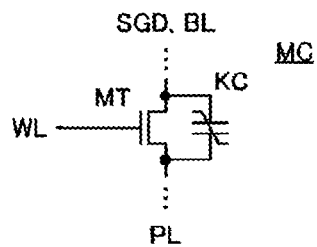

As shown in FIGS. 5A and 5B, the columnar main portion 4b includes a core insulating film 42, a ferroelectric film 43, a semiconductor film 44, and an insulating film 45. FIG. 5A is a cross-sectional view showing a configuration of a memory cell, and is an enlarged cross-sectional view of a portion including the memory cell MC (one of MC0 to MCn) in FIG. 4. FIG. 5B shows a cross section taken along a line B-B in FIG. 5A. FIG. 5C shows an equivalent circuit of each memory cell MC.

The core insulating film 42 is disposed near a central axis of the columnar body 4 and extends along the central axis of the columnar body 4. The core insulating film 42 may be formed of a material containing an insulating material (for example, silicon nitride) as a main component. The core insulating film 42 has a substantially I shape in a ZY cross-sectional view and in a ZX cross-sectional view.

The ferroelectric film 43 is disposed between the core insulating film 42 and the conductive layer 6, and extends along the central axis of the columnar body 4 so as to surround the core insulating film 42. The ferroelectric film 43 may be formed of a ferroelectric material as a main component. For example, the ferroelectric film 43 may be formed of a material containing a perovskite-based oxide such as HfO (hafnium oxide), PZT (lead zirconate titanate PbZrTiO$_3$), SBT (strontium bismuth tantalate SrBi$_2$Ta$_2$O$_9$) and BLT (lanthanum-added bismuth titanate (Bi,La)4Ti3O12), organic polymer, and the like as a main component. The ferroelectric film 43 has a substantially columnar shape and substantially cylindrical shape.

The semiconductor film 44 is disposed between the ferroelectric film 43 and the conductive layer 6 and extends along the central axis of the columnar body 4 so as to surround the ferroelectric film 43. The semiconductor film 44 may be formed of a material containing a semiconductor (for example, silicon) as a main component. The semiconductor film 44 has a substantially cylindrical shape. A lower end (end portion on the −Z side) of the semiconductor film 44 is electrically connected to the semiconductor film 41.

The insulating film 45 is disposed between the semiconductor film 44 and the conductive layer 6 and extends along the central axis of the columnar body 4 so as to surround the semiconductor film 44. The insulating film 45 may be formed of a material containing an insulating material (for example, silicon nitride) as a main component.

In the columnar main portion 4b, a region that intersects the conductive layer 6 functions as the memory cell MC as indicated by a dashed-dotted line in FIG. 5A. Within the region that functions as the memory cell MC, as shown by a dotted line in FIG. 5A, a portion where the conductive layer 6/the insulating film 45/the semiconductor film 44 are stacked in a radial direction of the columnar body 4 functions as a memory transistor MT; as shown by a two-dotted chain line in FIG. 5A, a portion where the semiconductor film 44/the ferroelectric film 45 are stacked in the radial direction of the columnar body 4 functions as a ferroelectric capacitor KC.

The columnar upper portion 4c shown in FIG. 4 is disposed on the columnar main portion 4b (+Z side). The columnar upper portion 4c extends from the Z position between the (n+1)th conductive layer 6 (WL0) and the drive electrode films 60 to 63 to a Z position higher than the drive electrode films 60 to 63. A drain-side select transistor DST is formed at a position where the columnar upper portion 4c intersects the drive electrode films 60 to 63. The columnar upper portion 4c includes a semiconductor film 47 and an insulating film 48.

The semiconductor film 47 is disposed at a position including the central axis of the columnar body 4 and extends along the central axis of the columnar body 4. The semiconductor film 47 may be formed of a material containing a semiconductor (for example, silicon) as a main component. The semiconductor film 47 has a substantially I shape in the ZY cross-sectional view and substantially I shape in the ZX cross-sectional view. A lower end (end portion on the −Z side) of the semiconductor film 47 is electrically connected to the semiconductor film 44. An upper end (end portion on the +Z side) of the semiconductor film 47 is electrically connected to a conductive layer 5 (bit line BLm). The semiconductor film 41, the semiconductor film 44, and the semiconductor film 47 form a columnar semiconductor member extending continuously from the surface 31 of the substrate 3 to the Z position higher than the drive electrode films 60 to 63, include a channel region (active region) in the memory chain CH, and can be formed using a material containing a semiconductor (for example, polysilicon) containing substantially no impurities as a main component.

The insulating film 48 is disposed between the semiconductor film 44 and the conductive layer 6 and extends along the central axis of the columnar body 4 so as to surround the semiconductor film 44. The insulating film 45 may be formed of a material containing an insulating material (for example, silicon nitride) as a main component. The lower end (end portion on the −Z side) of the insulating film 48 is connected to the insulating film 45, and the insulating film 48 and the insulating film 45 form an insulating film extending continuously from the Z position between the first conductive layer 6 (WLn) and the surface 31 of the substrate 3 to the Z position higher than the drive electrode films 60 to 63.

An interlayer insulating film 8 is disposed on the drive electrode films 60 to 63 (+Z side). The interlayer insulating film 8 may be formed of a material containing an insulating material (for example, a semiconductor oxide such as silicon oxide) as a main component.

The conductive layer 5 is also disposed on the interlayer insulating film 8. The conductive layer 5 functions as the bit line BL. The conductive layer 5 may be formed of a material containing a conductive material (for example, a metal such as tungsten or aluminum) as a main component.

A contact plug (not shown) may be disposed between the conductive layer 5 and the semiconductor film 47. In this case, the contact plug comes into contact with the conductive layer 5 at an upper end and contacts the semiconductor film 47 at a lower end so that the conductive layer 5 and the semiconductor film 47 can be electrically connected. The contact plug functions as a bit line contact. The contact plug may be formed of a material containing a conductive material (for example, a metal such as tungsten) as a main component.

With such a structure, the memory cell MC in which the memory transistor MT and the ferroelectric capacitor KC are connected in parallel is formed.

Next, operation of the semiconductor storage device 1 will be described with reference to FIGS. 3 and 6. FIG. 6 is a waveform diagram showing the operation of the semiconductor storage device 1.

For example, in the semiconductor storage device 1, the peripheral circuit 10 (see FIG. 2) performs a write operation on the memory cell MC specified by the row address and the column address when receiving a write command, and performs a read operation on the memory cell MC specified by the row address and the column address when receiving the read command.

As described above, the memory cell array 2 includes a plurality of blocks BLK. As shown in FIG. 3, each block BLK includes a plurality of chain units CU corresponding to the select gate lines SGD. Each chain unit CU includes a memory chain CH including a plurality of memory cells MC0 to MCn and a drain-side select transistor DST connected in series. Each memory cell MC includes a memory transistor MT and a ferroelectric capacitor KC connected in parallel.

When a memory cell MC in the block BLK is accessed, a voltage of the select gate line SGD corresponding to the chain unit CU to which the memory chain CH including the target memory cell MC belongs, is set to an active level (for example, high level $V_{H1}$). Further, a voltage of a selected word line WL corresponding to the target memory cell MC in the memory chain CH, is set to the active level (for example, low level $V_{L1}$), and a voltage of the non-selected word line WL corresponding to other memory cells MC, is set to the non-active level (for example, high level $V_{H1}$). Accordingly, in the memory cells MC corresponding to the non-selected word line WL in the memory chain CH, the memory transistor MT is turned on. Even if a voltage difference is generated between the bit line BL and the plate line PL, a current flows only through the memory transistor MT and no voltage difference is applied to the ferroelectric capacitor KC. That is, the ferroelectric capacitor KC corresponding to the non-selected word line WL does not influence the electrical operation (or influence thereof can be substantially ignored). On the other hand, in the memory cell MC corresponding to the selected word line WL in the memory chain CH, the memory transistor MT is turned off. When a voltage difference is generated between the bit line BL and the plate line PL, the voltage difference is applied to the ferroelectric capacitor KC. That is, only the ferroelectric capacitor KC corresponding to the selected word line WL in the memory chain CH influences the electrical operation.

For example, in the semiconductor storage device 1, the peripheral circuit 10 (see FIG. 2) performs the write operation as shown in FIGS. 6A and 6C when receiving a write command, and performs the read operation as shown in FIGS. 6A and 6B when receiving a read command. FIG. 6A is a diagram showing a waveform of a signal commonly used in the write operation and the read operation. FIG. 6B is a diagram showing a waveform of a signal used in the read operation. FIG. 6C is a diagram showing a waveform of a signal used in the write operation.

In the write operation shown in FIGS. 6A and 6C, the peripheral circuit 10 determines the selected word line and the selected chain unit in the memory cell array 2 in accordance with the row address included in the write command.

Before a timing t1, the peripheral circuit 10 sets a voltage of the bit line BL to a first drive level (for example, low level $V_L$), and sets a voltage of the plate line PL to the first drive level (for example, low level $V_L$). For example, high level $V_H$=5 V, low level $V_L$=0 V, or high level $V_H$=3 V, and low level $V_L$=0 V.

At a timing t1, the peripheral circuit 10 maintains a voltage of a non-selected word line WL (non-selected WL) at a non-active level (for example, high level $V_{H1}$) and changes a voltage of the selected word line WL (selected WL) from the non-active level (for example, high level $V_{H1}$) to an active level (for example, low level $V_{L1}$). Accordingly, a memory transistor of a selected memory cell in each memory chain CH is selectively turned off, and a memory transistor of a non-selected memory cell is maintained in an ON state. For example, the high level $V_{H1}$=5 V and the low level $V_{L1}$=0 V, or the high level $V_{H1}$=3 V, and low level $V_{L1}$=0 V.

For example, when the word line WL2 is determined to be the selected word line, the memory transistor MT of the selected memory cell MC2 in each memory chain CH is selectively turned off, and the memory transistors MT of the non-selected memory cells MC0, MC1, and MC3 to MCn are maintained in the ON state (see FIG. 3).

At a timing t2, the peripheral circuit 10 maintains the voltage of the select gate line SGD of the non-selected chain unit at the non-active level (for example, low level $V_{L1}$) and changes the voltage of the select gate line SGD of the selected chain unit from the non-active level (for example, low level $V_{L1}$) to an active level (for example, high level $V_{H1}$). Accordingly, the drain-side select transistor DST of the selected chain unit is selectively turned on, and the drain-side select transistor DST of the non-selected chain unit is maintained in an OFF state.

For example, when the chain unit CU0 is determined as the selected chain unit, the drain-side select transistor DST of the selected chain unit CU0 is selectively turned on, and the drain-side select transistors DST of the non-selected chain units CU1 to CU3 are maintained in the OFF state (see FIG. 3).

At a timing t3, the peripheral circuit 10 changes the voltage of the plate line PL from the first drive level (for example, low level $V_L$) to a second drive level (for example, high level $V_H$), and maintains the voltage at the second drive level. At a timing t5, the peripheral circuit 10 changes the voltage of the plate line PL from the second drive level (for example, high level $V_H$) to the first drive level (for example, low level $V_L$), and maintains the voltage at the first drive level.

For example, when data of "1" is written to the selected memory cell, the peripheral circuit 10 maintains the voltage of the selected bit line BL at the first drive level (for example, low level $V_L$) until the timing t5. After the timing t5, at a timing t7, the peripheral circuit 10 changes the voltage of the selected bit line BL from the first drive level (for example, low level $V_L$) to the second drive level (for example, high level $V_H$). In the period from the timing t7 to a timing t8, the peripheral circuit 10 maintains the voltage of the selected bit line BL at the second drive level (for example, high level $V_H$).

Figure 7A:
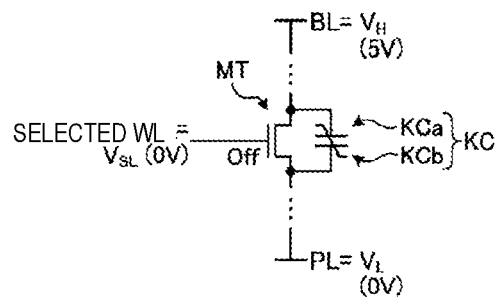
FIGS. 7A to 7H are diagrams showing operation of the memory cell according to the embodiment.
Figure 7B:
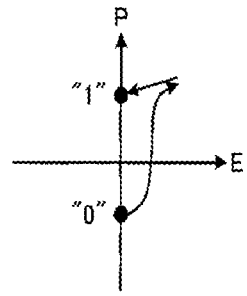

At this time, as shown in FIGS. 7A and 7B, when data of "0" is written in a ferroelectric capacitor KC, the polarization (P) of the ferroelectric capacitor KC is inverted and the data of "1" is written in the selected memory cell. FIGS. 7A and 7B are diagrams showing the write operation of "1" in the memory cell.

In the ferroelectric capacitor KC, data of "0" is written as shown in FIG. 7B in a state where the polarization is such that one end KCa is positive and the other end KCb is negative. As shown in FIG. 7A, in accordance with the bit line BL=$V_H$, positive charges (holes) are accumulated from the bit line BL to the one end KCa of the ferroelectric capacitor KC connected to the selected memory transistor MT through a channel region of the non-selected memory transistor MT. In accordance with the plate line PL=$V_L$, negative charges (electrons) are accumulated from the plate line PL to the other end KCb of the ferroelectric capacitor KC connected to the selected memory transistor MT through the channel region of the non-selected memory transistor MT. Accordingly, the polarization (P) of the ferroelectric capacitor KC is such that the one end KCa is negative and the other end KCb is positive, and data of "1" is written as shown in FIG. 7B.

When the data of "1" is written in the ferroelectric capacitor KC, the selected memory cell maintains the polarization (P) of the ferroelectric capacitor KC and maintains the state in which the data of "1" is written.

At the timing t8 shown in FIG. 6A, the peripheral circuit 10 changes the voltage of the selected bit line BL from the second drive level (for example, high level $V_H$) to the first drive level (for example, low level $V_L$), and then maintains the voltage at the first drive level.

On the other hand, when the data of "0" is written to the selected memory cell, the peripheral circuit 10 maintains the voltage of the selected bit line BL at the first drive level (for example, low level $V_L$) until the timing t5 and after the timing t5. Accordingly, the peripheral circuit 10 writes the data of "0" to the selected memory cell during the period from the timing t4 to the timing t5.

Figure 7C:
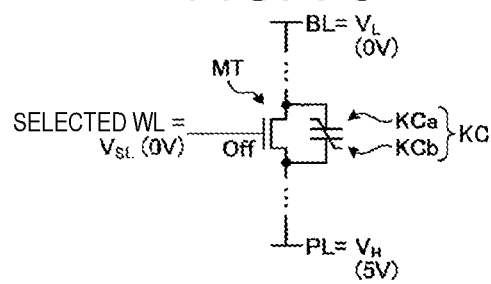
Figure 7D:
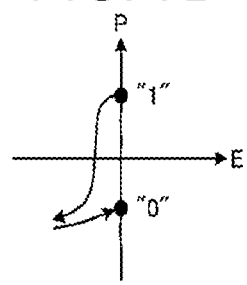

At this time, as shown in FIGS. 7C and 7D, when the data of "1" is written in a ferroelectric capacitor KC, the polarization (P) of the ferroelectric capacitor KC is inverted and the data of "0" is written in the selected memory cell. FIGS. 7C and 7D are diagrams showing a write operation of "0" of the memory cell.

In the ferroelectric capacitor KC, the data of "1" is written as shown in FIG. 7D in a state where the polarization is such that the one end KCa is negative and the other end KCb is positive. As shown in FIG. 7C, in accordance with the bit line BL=$V_L$, negative charges (electrons) are accumulated from the bit line BL to the one end KCa of the ferroelectric capacitor KC connected to the selected memory transistor MT through a channel region of the non-selected memory transistor MT. In accordance with the plate line PL=$V_H$, positive charges (holes) are accumulated from the plate line PL to the other end KCb of the ferroelectric capacitor KC connected to the selected memory transistor MT through the channel region of the non-selected memory transistor MT. Accordingly, the polarization (P) of the ferroelectric capacitor KC is such that the one end KCa is positive and the other end KCb is negative, and the data of "0" is written as shown in FIG. 7D.

When the data of "0" is written in the ferroelectric capacitor KC, the selected memory cell maintains the polarization (P) of the ferroelectric capacitor KC and maintains the state in which the data of "0" is written.

At a timing t9, the peripheral circuit 10 maintains the voltage of the select gate line SGD of the non-selected chain units at the non-active level (for example, low level $V_{L1}$) and changes the voltage of the select gate line SGD of the selected chain unit from the active level (for example, high level $V_{H1}$) to the non-active level (for example, low level $V_{L1}$). Accordingly, the drain-side select transistor DST of the selected chain unit is turned off, and the drain-side select transistor DST of each chain unit is maintained in the OFF state.

At a timing t10, the peripheral circuit 10 maintains a voltage of a non-selected word line WL (non-selected WL) at the non-active level (for example, high level $V_{H1}$) and changes the voltage of the selected word line WL (selected WL) from the active level (for example, low level $V_{L1}$) to the non-active level (for example, high level $V_{H1}$). Accordingly, the memory transistor of the selected memory cell in each memory chain CH is turned on, and the memory transistor of each memory cell is maintained in the ON state.

In the read operation shown in FIGS. 6A and 6B, the peripheral circuit 10 determines the selected word line, the selected bit line, and the selected chain unit in the memory cell array 2 in accordance with the row address and the column address included in the read command.

Before the timing t1, the peripheral circuit 10 sets a sense amplifier enable signal SAE to the non-active level (for example, low level $V_{L1}$), and the sense amplifier releases the voltage control of the bit line BL. Accordingly, the voltage of the bit line BL is at a floating voltage $V_{FL11}$. The floating voltage $V_{FL11}$ is substantially equal to the low level $V_L$.

At the timing t3, the peripheral circuit 10 changes the voltage of the plate line PL from the first drive level (for example, low level $V_L$) to the second drive level (for example, high level $V_H$), and maintains the voltage at the second drive level.

For example, at the timing t3, when the data of "1" is written in the ferroelectric capacitor KC of the selected memory cell, the polarization is such that the one end KCa is negative and the other end KCb is positive. The one end KCa accumulates positive charges (holes) and the other end KCb accumulates negative charges (electrons). In accordance with the plate line PL=$V_H$, positive charges (holes) are accumulated from the plate line PL to the other end KCb of the ferroelectric capacitor KC connected to the selected memory transistor MT through the channel region of the non-selected memory transistor MT. Accordingly, the positive charges (holes) accumulated at the one end KCa are discharged to the bit line BL so that the voltage of the bit line BL rises from the floating voltage $V_{FL11}$ to a floating voltage $V_{FL12}$.

Figure 7E:
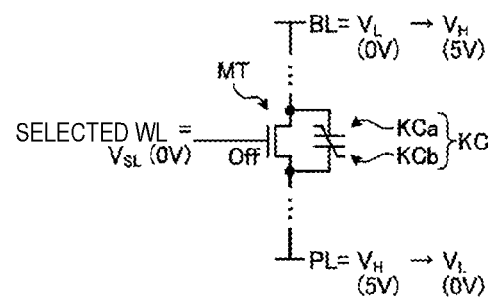
Figure 7F:
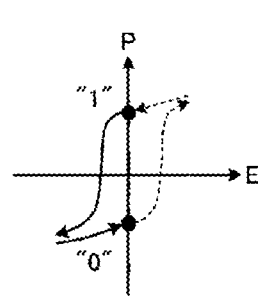

At this time, as shown in FIGS. 7E and 7F, the selected memory cell performs destructive readout. FIGS. 7E and 7F are diagrams showing the read operation of "1" of the memory cell. That is, in accordance with the bit line BL=$V_{FL11} \approx V_L$ and the plate line PL=$V_H$, as shown by the solid line in FIG. 7F, the polarization (P) of the ferroelectric capacitor KC is inverted and the written data of "1" is read out and destroyed to "0". The mechanism is the same as the write operation of "0" shown in FIGS. 7C and 7D. Therefore, it is desired to rewrite the data of "1" back to the selected memory cell.

At the timing t4, the peripheral circuit 10 sets the sense amplifier enable signal SAE from the non-active level (for example, low level $V_{L1}$) to the active level (for example, high level $V_{H1}$), and causes the sense amplifier to determine the voltage of the bit line BL. In this case, since the floating voltage $V_{FL12}$ which is the voltage of the bit line BL is higher than a determination voltage $V_t$, the sense amplifier determines that the data of "1" is written in the selected memory cell, and controls the voltage of the bit line BL to the voltage of the high level $V_H$ according to the determination result.

At the timing t5, the peripheral circuit 10 changes the voltage of the plate line PL from the second drive level (for example, high level $V_H$) to the first drive level (for example, low level $V_L$), and maintains the voltage at the first drive level.

At this time, as shown in FIGS. 7E and 7F, the selected memory cell performs rewriting of the data of "1". That is, in accordance with the bit line BL=$V_H$ and the plate line PL=$V_L$, as shown by the dotted line in FIG. 7F, the polarization (P) of the ferroelectric capacitor KC is inverted, and the data of "1" is rewritten. The mechanism is the same as the write operation of "1" shown in FIGS. 7A and 7B.

Alternatively, at the timing t3, when the data of "0" is written in the ferroelectric capacitor KC of the selected memory cell, the polarization is such that the one end KCa is positive and the other end KCb is negative. The one end KCa accumulates negative charges (electrons) and the other end KCb accumulates positive charges (holes). In accordance with the plate line PL=$V_H$, positive charges (holes) are accumulated from the plate line PL to the other end KCb of the ferroelectric capacitor KC connected to the selected memory transistor MT through the channel region of the non-selected memory transistor MT. Accordingly, since the negative charges (electrons) are drawn toward the one end KCa from the bit line BL and the negative charges (electrons) are accumulated at the one end KCa, the voltage of the bit line BL rises from the floating voltage $V_{FL11}$ to a floating voltage $V_{FL13}$.

Figure 7G:
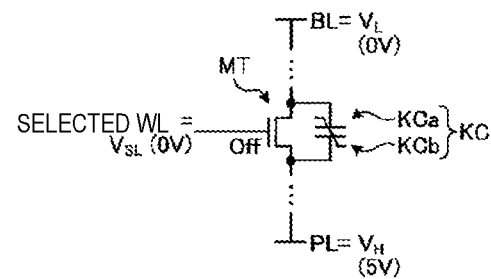
Figure 7H:
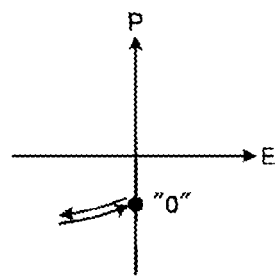

At this time, as shown in FIGS. 7G and 7H, the selected memory cell performs non-destructive readout. FIGS. 7G and 7H are diagrams showing the read operation of "0" of the memory cell. That is, in accordance with the bit line BL=$V_{FL11} \approx V_L$ and the plate line PL=$V_H$, as shown by the solid line in FIG. 7H, the written data of "0" is read out without inverting the polarization (P) of the ferroelectric capacitor KC.

At the timing t4, the peripheral circuit 10 sets the sense amplifier enable signal SAE from the non-active level (for example, low level $V_{L1}$) to the active level (for example, high level $V_{H1}$), and causes the sense amplifier to determine the voltage of the bit line BL. In this case, since the floating voltage $V_{FL13}$ which is the voltage of the bit line BL is lower than the determination voltage $V_t$, the sense amplifier determines that the data of "0" is written in the selected memory cell and controls the voltage of the bit line BL to the voltage of the low level $V_L$ according to the determination result.

At this time, as shown in FIGS. 7G and 7H, the selected memory cell performs rewriting of the data of "0". That is, in accordance with the bit line BL=$V_L$ and the plate line PL=$V_H$, as shown by the solid line in FIG. 7H, the data of "0" is rewritten without inverting the polarization (P) of the ferroelectric capacitor KC.

Thereafter, at the timing t8, the peripheral circuit sets the sense amplifier enable signal SAE from the active level (for example, high level $V_{H1}$) to the non-active level (for example, low level $V_{L1}$), and the sense amplifier releases the voltage control of the bit line BL again. Accordingly, the voltage of the bit line BL is at the floating voltage $V_{FL11}$. The floating voltage $V_{FL11}$ is substantially equal to the low level $V_L$.

Timings t9 and t10 are the same as those of the write operation.

As described above, on the substrate 3 of the semiconductor storage device (for example, ferroelectric memory) 1 according to the present embodiment, the stacked body LMB in which the conductive layers 6 and the insulating layers 7 are alternately and repeatedly stacked is penetrated by the columnar body 4 including the ferroelectric film 43 and the semiconductor film 44, and a three-dimensional array of the memory cells MC is formed at positions where the conductive layers 6 and the columnar body 4 intersect. Accordingly, the arrangement density of the memory cells MC in the semiconductor storage device 1 can be improved and the semiconductor storage device 1 can easily achieve high integration.

The operation in FIG. 6 mainly illustrates a case where the read and write operation to the selected memory cell is controlled by a combination of the driving of the plate line PL and the driving of the bit line BL. If the plate line PL can be driven at a constant voltage, the read and write operation to the selected memory cell can be substantially controlled by driving the bit line BL, so that high-speed control can be expected.

Based on such a concept, the semiconductor storage device 1 may perform operation as shown in FIG. 8. FIG. 8 is a waveform diagram showing operation of the semiconductor storage device 1 according to a first modification of the embodiment. That is, in the write operation shown in FIGS. 8A and 8C and the read operation shown in FIGS. 8A and 8B, the semiconductor storage device 1 may control the voltage of the plate line PL to an intermediate level (for example, intermediate level ($V_H$+$V_L$)/2 between the high level $V_H$ and the low level $V_L$). When the high level $V_H$=5 V and the low level $V_L$=0 V, the intermediate level ($V_H$+$V_L$)/2 may be 2.5 V. When the high level $V_H$=3 V and the low level $V_L$=0 V, the intermediate level ($V_H$+$V_L$)/2=1.5 V.

In the write operation shown in FIGS. 8A and 8C, when writing the data of "1" to the selected memory cell, the peripheral circuit 10 of the semiconductor storage device 1 can start driving the voltage of the selected bit line BL to the second drive level from a timing t11 between a drive start timing t1 of the selected word line WL and a drive start timing t2 of the select gate line SGD. Further, the peripheral circuit 10 can maintain the voltage of the selected bit line BL at the second drive level until a timing t14 between a drive end timing t9 of the select gate line SGD and a drive end timing t10 of the selected word line WL. Accordingly, a writing time of the data of "1" can be made equal to a driving time of the select gate line SGD and a charging time of the bit line BL can be easily ensured, so that the write operation can be easily performed at a high-speed.

In the read operation shown in FIGS. 8A and 8B, it is not necessary to ensure a timing margin such as between the timing t2 and the timing t3 shown in FIG. 6A, and operation of raising the voltage of the bit line BL from the floating voltage $V_{FL11}$ to the floating voltage $V_{FL12}$ or $V_{FL13}$ can be started from the timing t2. In addition, rewriting of the data of "0" and rewriting of the data of "1" performed during separate periods (period from timing t4 to t5 and period from timing t7 to t8 shown in FIG. 6B) can be performed in a common period (period from timing t12 to t13). Accordingly, the time from the start of driving of the bit line BL to the end of the driving can be shortened so that the read operation can be easily performed at a high-speed.

In both the write operation shown in FIGS. 8A and 8C and the read operation shown in FIGS. 8A and 8B, a voltage difference between the plate line PL and the bit line BL applied to the selected memory cell is approximately half of a voltage difference of the embodiment so that the selected memory cell operates in a region with a small hysteresis of the ferroelectric material. In this case, a signal amplitude decreases and a level width to be driven also decreases. From this viewpoint, the write operation and the read operation can be performed at a high-speed.

Thus, in the first modification of the embodiment, the drive control of the plate line PL can be simplified (that is, the configuration of the peripheral circuit 10 can be simplified). Accordingly, the write operation and the read operation can be performed at a high-speed.

Figure 9:
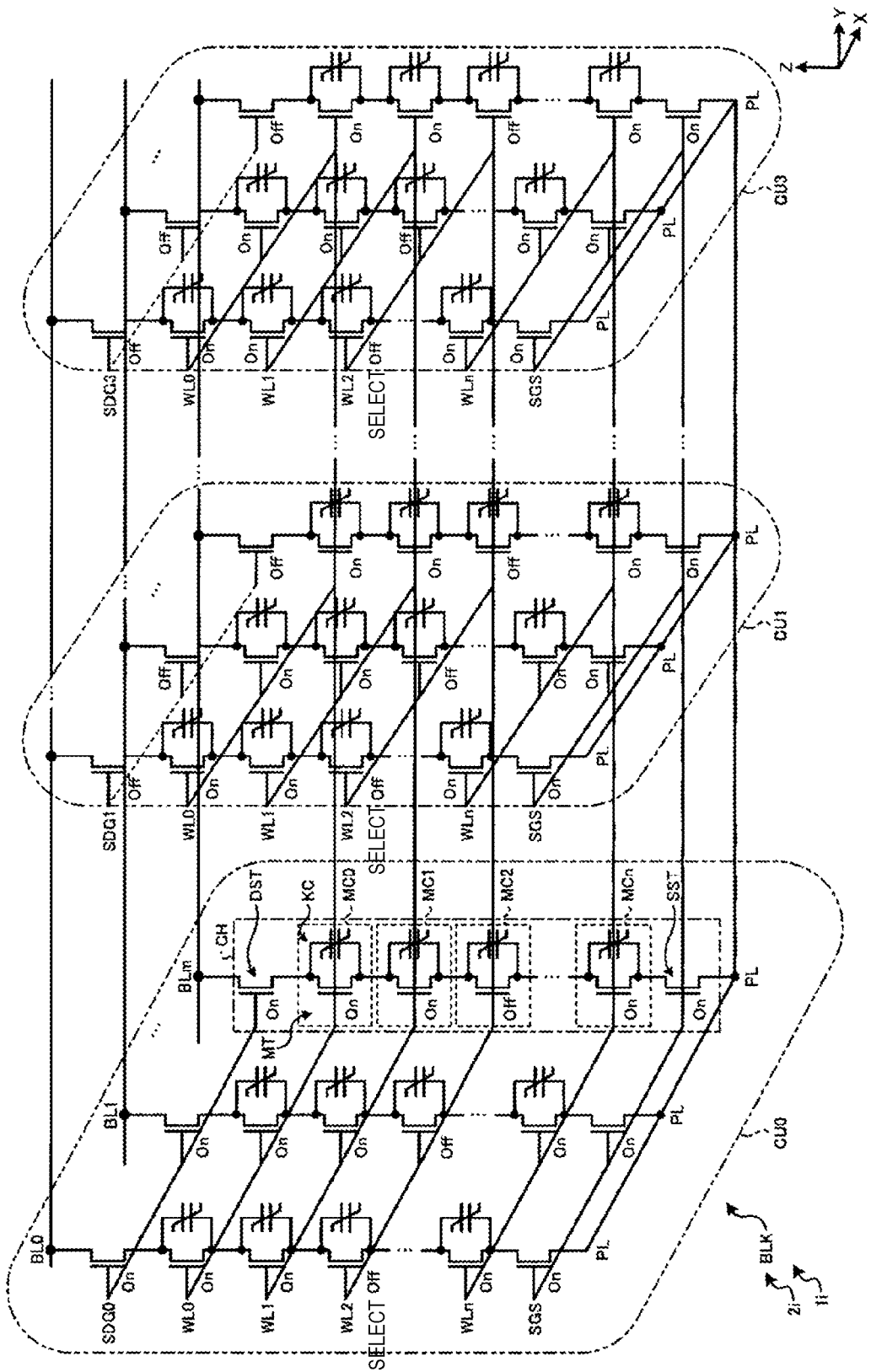
FIG. 9 is a circuit diagram showing a configuration of a memory cell array according to a second modification of the embodiment.

Alternatively, as shown in FIG. 9, each memory chain CH in a memory cell array 2i of a semiconductor storage device 1i may further include a source-side select transistor SST between a source-side (−Z side) memory cell MCn and the plate line PL. FIG. 9 is a circuit diagram showing a configuration of the memory cell array 2i according to a second modification of the embodiment. Each select transistor SST is, for example, one transistor. Each memory chain CH is formed by connecting the source-side select transistor SST in series to the memory transistor MT of the memory cell MCn, which is on the most source side of the memory cells MC0 to MCn, and connecting the drain-side select transistor DST in series to the memory transistor MT of the memory cell MC0, which is on the most drain side. In addition, with the addition of the select transistor SST to each memory chain CH, the block BLK is further provided with a select gate line SGS. The select gate line SGS is electrically connected to a gate of each select transistor SST.

Figure 10:
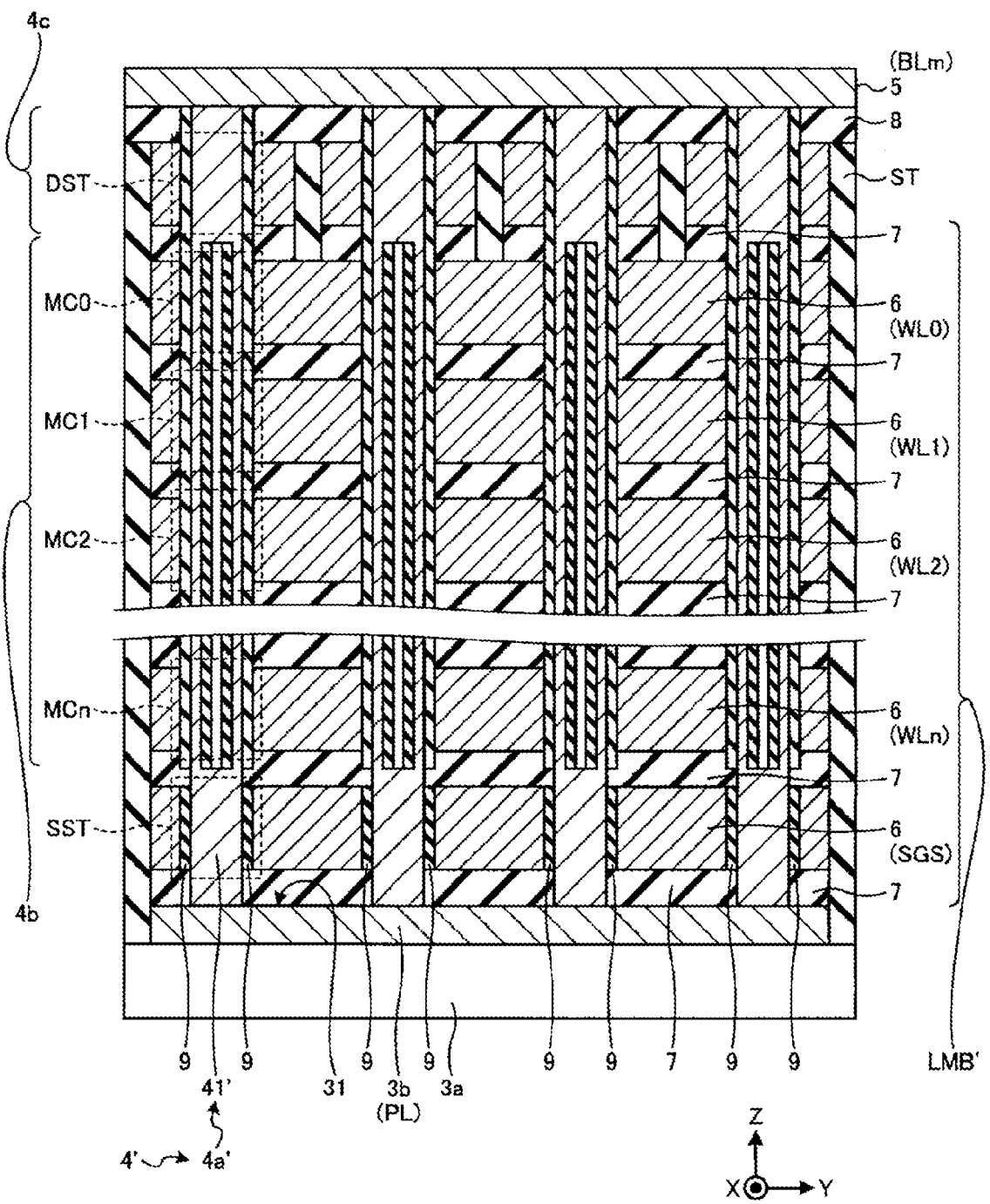
FIG. 10 is a cross-sectional view showing the configuration of the memory cell array according to the second modification of the embodiment.

At this time, the memory cell array 2i may have the configuration shown in FIG. 10. FIG. 10 is a cross-sectional view showing a configuration of the memory cell array 2i according to the second modification of the embodiment. A stacked body LMB' shown in FIG. 10 may be obtained from the stacked body LMB shown in FIG. 4 by adding a configuration in which the conductive layers 6 and the insulating layers 7 are stacked from the −Z side to the +Z side between a lowermost (most −Z side) insulating layer 7 and the substrate 3. The added conductive layer 6 functions as the select gate line SGS.

A columnar body 4' includes a columnar lower portion 4a' instead of the columnar lower portion 4a (see FIG. 4). The columnar lower portion 4a' includes a semiconductor film 41'. The semiconductor film 41' extends from the surface 31 of the substrate 3 to a Z position between the first conductive layer 6 (SGS) and the second conductive layer 6 (WLn). Insulating films 9 are disposed between the columnar lower portion 4a' and the conductive layer 6. The insulating film 9 may be formed of a material containing an insulating material (for example, a semiconductor oxide such as silicon oxide) as a main component. Accordingly, the source-side select transistor SST is formed at a position where the columnar lower portion 4a' intersects the first conductive layer 6 (SGS).

In addition, with the addition of the source-side select transistor SST to each memory chain CH, as shown in FIG. 11, the semiconductor storage device 1i may perform operation different from the operation shown in FIG. 6 in the following respects. FIG. 11 is a waveform diagram showing operation of the semiconductor storage device according to the second modification of the embodiment.

A drive waveform of the select gate line SGS is added to both the write operation shown in FIGS. 11A and 11C and the read operation shown in FIGS. 11A and 11B.

At the timing t2, the peripheral circuit 10 changes a voltage of the select gate line SGS of each chain unit from a non-active level (for example, low level $V_{L1}$) to an active level (for example, high level $V_{H1}$). At the same time, the peripheral circuit 10 maintains a voltage of the select gate line SGD of a non-selected chain unit at the non-active level (for example, low level $V_{L1}$) and changes a voltage of the select gate line SGD of a selected chain unit from the non-active level (for example, low level $V_{L1}$) to the active level (for example, high level $V_{H1}$). Accordingly, the source-side select transistor SST of each chain unit is turned on, the drain-side select transistor DST of the selected chain unit is selectively turned on, and the drain-side select transistor DST of the non-selected chain unit is maintained in an OFF state.

For example, when the chain unit CU0 is determined as the selected chain unit, the source-side select transistors SST of all the chain units CU0 to CU3 are turned on, the drain-side select transistor DST of the selected chain unit CU0 is selectively turned on, and the drain-side select transistors DST of the non-selected chain units CU1 to CU3 are maintained in the OFF state (see FIG. 9).

At the timing t9, the peripheral circuit 10 changes the voltage of the select gate line SGS of each chain unit from the active level (for example, high level $V_{H1}$) to the non-active level (for example, low level $V_{L1}$). At the same time, the peripheral circuit 10 maintains the voltage of the select gate line SGD of the non-selected chain unit at the non-active level (for example, low level $V_{L1}$) and changes the voltage of the select gate line SGD of the selected chain unit from the active level (for example, high level $V_{H1}$) to the non-active level (for example, low level $V_{L1}$). Accordingly, the source-side select transistor SST of each chain unit is turned off, the drain-side select transistor DST of the selected chain unit is turned off, and the drain-side select transistor DST of each chain unit is maintained in the OFF state.

As described above, in the first modification of the embodiment, the stacked body LMB' corresponding to the configuration in which the source-side select transistor SST is added to each memory chain CH, is penetrated by the columnar body 4' including the ferroelectric film 43 and the semiconductor film 44, and the three-dimensional array of memory cells MC is formed at positions where the conductive layers 6 and the columnar body 4' intersect. Accordingly, the arrangement density of the memory cells MC in the semiconductor storage device 1i can be improved and the semiconductor storage device 1i can easily achieve high integration.

Figure 12A:
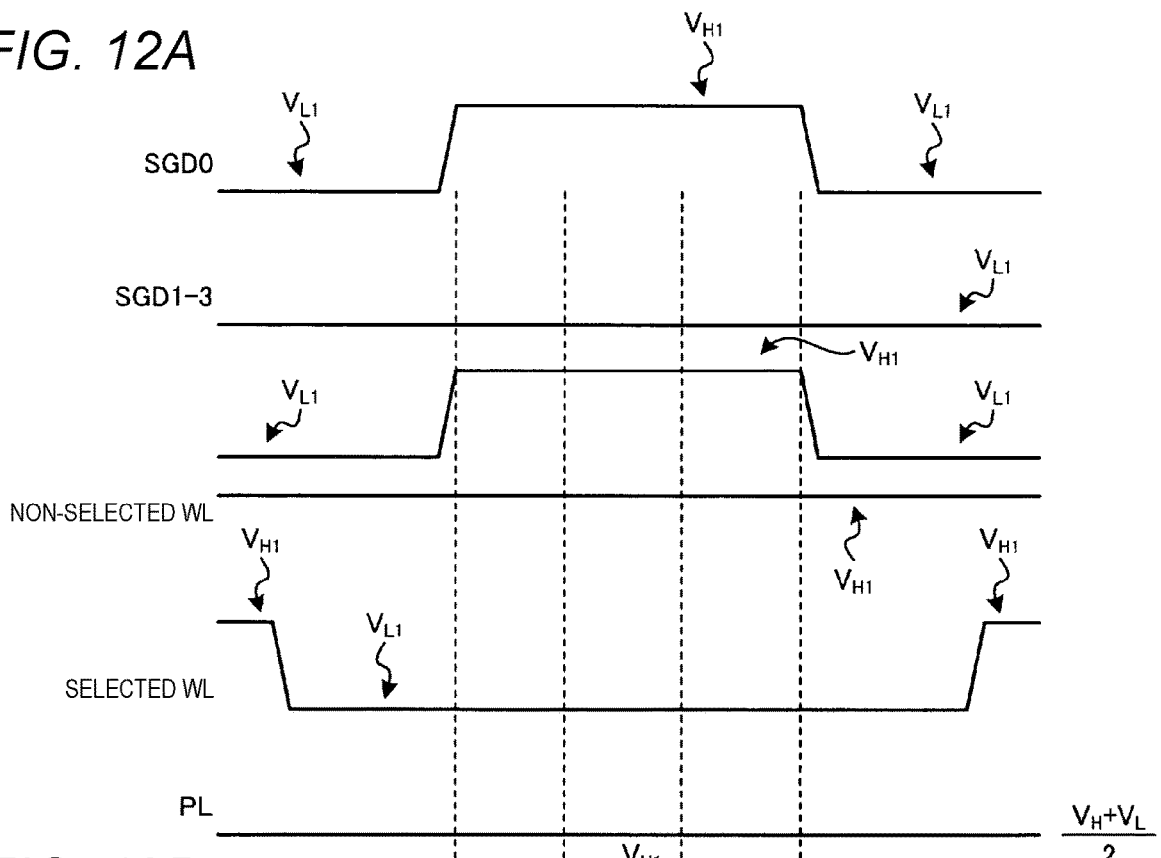
FIGS. 12A to 12C are waveform diagrams showing operation of a semiconductor storage device according to a third modification of the embodiment.
Figure 12B:
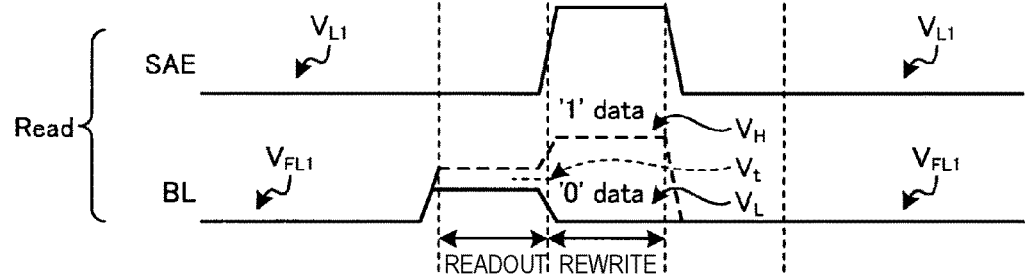
Figure 12C:
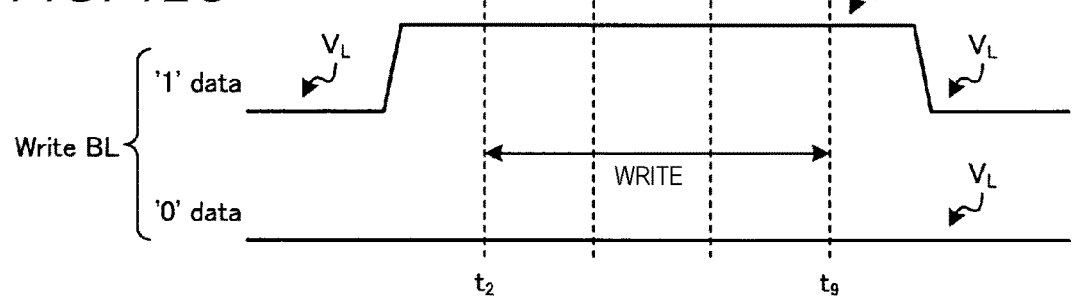

Alternatively, the semiconductor storage device 1i may perform operation as shown in FIG. 12. FIG. 12 is a waveform diagram showing operation of the semiconductor storage device 1i according to a third modification of the embodiment. The operation shown in FIG. 12 may obtained from the operation shown in FIG. 11 by performing the same change as the change from the operation shown in FIG. 6 to the operation shown in FIG. 8. As shown in FIG. 12, the semiconductor storage device 1i performs the same operation as the operation shown in FIG. 8 except that the driving of the select gate line SGS is started at a timing t2 and the driving of the select gate line SGS is ended at a timing t9.

According to such operation, in the third modification of the embodiment, the drive control of the plate line PL can be simplified. Accordingly, the write operation and the read operation can be performed at high-speed.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a stacked body in which a plurality of first conductive layers are arranged to be spaced apart from each other in a stacking direction; and
a columnar body that penetrates the stacked body in the stacking direction, wherein the columnar body includes:
a columnar ferroelectric film;
a semiconductor film disposed between the ferroelectric film and the first conductive layers; and
an insulating film disposed between the semiconductor film and the first conductive layers, wherein
a memory chain is formed at positions where the plurality of first conductive layers and the columnar body intersect, the memory chain including a plurality of memory cells connected in series,
the stacked body further includes a drive electrode film at a position higher than an upper end of the ferroelectric film,
the semiconductor film and the insulating film of the columnar body extend to a height position of the drive electrode film, and
a first select transistor is formed at a position where the drive electrode film and the columnar body intersect, the first select transistor being connected to one end of the memory chain.

2. The semiconductor storage device according to claim 1, wherein
the stacked body further includes a lowermost first conductive layer at a position lower than a lower end of the ferroelectric film,
the semiconductor film of the columnar body extends to a height position of the lowermost first conductive layer, and
a second select transistor is formed at a position where the lowermost first conductive layer and the columnar body intersect, the second select transistor being connected to the other end of the memory chain.

3. The semiconductor storage device according to claim 1, wherein
the memory cell is a one-transistor one-capacitor type memory cell.

4. The semiconductor storage device according to claim 3, wherein
the memory cell includes a transistor and a ferroelectric capacitor connected in parallel between a first end of the memory cell and a second end of the memory cell.

5. The semiconductor storage device according to claim 1, further comprising:
a second conductive layer connected to an upper end of the semiconductor film at a height position of an upper end of the columnar body; and
a third conductive layer connected to a lower end of the semiconductor film at a height position of a lower end of the columnar body.

6. A method of performing an operation to read data or write data in a semiconductor storage device that includes:
a stacked body in which a plurality of conductive layers are arranged to be spaced apart from each other in a stacking direction;
a columnar body that penetrates the stacked body in the stacking direction, wherein the columnar body includes a columnar ferroelectric film, a semiconductor film disposed between the ferroelectric film and the conductive layers, and an insulating film disposed between the semiconductor film and the conductive layers, wherein a plurality of memory cells connected in series is formed along the columnar body where the conductive layers intersect the columnar body;
a bit line connected to the columnar body; and
a plate line connected to the columnar body,
said method comprising:
applying different voltages to the bit line and the plate line to write first or second data into one of the memory cells.

7. The method according to claim 6, wherein the voltage applied to the bit line is lower than the voltage applied to the plate line when the first data is being written and the voltage applied to the bit line is higher than the voltage applied to the plate line when the second data is being written.

8. The method according to claim 7, wherein the voltage applied to the plate line when the first data is being written is different from the voltage applied to the plate line when the second data is being written.

9. The method according to claim 7, wherein the voltage applied to the plate line when the first data is being written is the same as the voltage applied to the plate line when the second data is being written.

10. The method according to claim 6, wherein
when data is read from a memory cell, an operation to read the data from the memory cell is executed and then an operation to rewrite the data into the memory cell is executed.

11. The method according to claim 6, wherein
the memory cells each include a transistor and a ferroelectric capacitor connected in parallel between a first end thereof and a second end thereof, and
the ferroelectric capacitor stores a charge having a first polarity when the memory cell stores the first data and a charge having a second polarity when the memory cell stores the second data.

12. The method according to claim 6, further comprising:
selecting one of the memory cells into which the first or second data is to be written, by applying a first voltage to the conductive layer connected to said one of the memory cells and applying a second voltage higher than the first voltage to the conductive layers connected to other memory cells.

13. A method of performing an operation to read data or write data in a semiconductor storage device that includes:
a stacked body in which a plurality of conductive layers are arranged to be spaced apart from each other in a stacking direction;
a columnar body that penetrates the stacked body in the stacking direction, wherein the columnar body includes a columnar ferroelectric film, a semiconductor film disposed between the ferroelectric film and the conductive layers, and an insulating film disposed between the semiconductor film and the conductive layers, wherein a plurality of memory cells connected in series is formed along the columnar body where the conductive layers intersect the columnar body;
a bit line connected to the columnar body;
a plate line connected to the columnar body; and
a sense amplifier connected the bit line,
said method comprising:
selecting one of the memory cells to read;
disconnecting the bit line from the sense amplifier to place the bit line in a floating state;
while the bit line is in the floating state, applying a first voltage to the plate line to raise a voltage of the bit line;
after the voltage of the bit line has been raised, connecting the bit line to the sense amplifier and comparing the voltage of the bit line against a reference voltage; and
determining that data read from the selected memory cell is first data if the voltage of the bit line is less than the reference voltage and second data if the voltage of the bit line is greater than the reference voltage.

14. The method according to claim 13, further comprising:
after said determining, while maintaining the connection between the bit line and the sense amplifier, lowering the voltage of the bit line to a second voltage if the first data is determined and raising the voltage of the bit line to a third voltage higher than the second voltage if the second data is determined.

15. The method according to claim 14, further comprising:
maintaining the plate line at the first voltage when the bit line is connected to the sense amplifier and during said comparing and determining; and
after said determining, while maintaining the connection between the bit line and the sense amplifier, applying the first voltage to the plate line during a first period to rewrite the first data in the memory cell and the third voltage to the plate line during a second period after the first period to rewrite the second data in the memory cell.

16. The method according to claim 14, further comprising:
maintaining the plate line at the first voltage during an entire period the bit line is connected to the sense amplifier to rewrite the first data if the voltage of the bit line is lowered to the second voltage and to rewrite the second data if the voltage of the bit line is raised to the third voltage,
wherein the first voltage is greater than the second voltage and less than the third voltage.

17. The method according to claim 13, wherein
the memory cells each include a transistor and a ferroelectric capacitor connected in parallel between a first end thereof and a second end thereof, and
the ferroelectric capacitor stores a charge having a first polarity when the memory cell stores the first data and a charge having a second polarity when the memory cell stores the second data.

18. The method according to claim 13, wherein
one of the memory cells is selected for read by applying a second voltage to the conductive layer connected to said one of the memory cells and applying a third voltage higher than the second voltage to the conductive layers connected to other memory cells.

* * * * *